United States Patent
Jang et al.

(10) Patent No.: US 10,219,385 B2
(45) Date of Patent: Feb. 26, 2019

(54) FLEXIBLE FILM, CIRCUIT BOARD ASSEMBLY INCLUDING THE SAME AND DISPLAY APPARATUS INCLUDING THE SAME

(71) Applicant: Samsung Display Co., Ltd., Yongin-Si, Gyeonggi-Do (KR)

(72) Inventors: Sehui Jang, Yongin-si (KR); Sung-dong Park, Asan-si (KR); Chongguk Lee, Yongin-si (KR); Byoungdoo Jeong, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/467,004

(22) Filed: Mar. 23, 2017

(65) Prior Publication Data
US 2018/0020550 A1 Jan. 18, 2018

(30) Foreign Application Priority Data
Jul. 15, 2016 (KR) .................. 10-2016-0090089

(51) Int. Cl.
  *H05K 1/11* (2006.01)
  *H05K 1/18* (2006.01)
  *H05K 1/02* (2006.01)
  *H05K 1/14* (2006.01)

(52) U.S. Cl.
  CPC ............. *H05K 1/189* (2013.01); *H05K 1/028* (2013.01); *H05K 1/111* (2013.01); *H05K 1/117* (2013.01); *H05K 1/118* (2013.01); *H05K 1/144* (2013.01); *H05K 1/0298* (2013.01); *H05K 1/147* (2013.01); *H05K 2201/094* (2013.01); *H05K 2201/09409* (2013.01); *H05K 2201/09418* (2013.01); *H05K 2201/10128* (2013.01)

(58) Field of Classification Search
  CPC .......... H05K 1/111; H05K 1/118; H05K 1/14; H05K 1/144; H05K 2201/09409; H05K 2201/09418
  See application file for complete search history.

(56) References Cited

U.S. PATENT DOCUMENTS

| | | | | |
|---|---|---|---|---|
| 9,898,943 | B2 * | 2/2018 | Guo | G09G 3/006 |
| 2003/0197200 | A1 * | 10/2003 | Kim | H01L 22/32 |
| | | | | 257/200 |
| 2005/0127493 | A1 * | 6/2005 | Yuzawa | H01L 23/49838 |
| | | | | 257/692 |

FOREIGN PATENT DOCUMENTS

| KR | 100390456 B1 | 6/2003 |
|---|---|---|
| KR | 100439128 B1 | 6/2004 |
| KR | 101356340 B1 | 1/2014 |
| KR | 101445117 B1 | 9/2014 |

* cited by examiner

Primary Examiner — Hoa C Nguyen
(74) Attorney, Agent, or Firm — Cantor Colburn LLP

(57) ABSTRACT

A flexible film includes a base film including an edge portion which extends in a first direction, a plurality of wirings disposed on the base film, and a plurality of pads which is disposed in the edge portion of the base film and connected to the plurality of wirings. The plurality of pads disposed in the edge portion include a plurality of horizontal pads horizontally arranged in the first direction to define a pad row extended in the first direction; and a vertical pad including a plurality of vertically arranged pads arranged in a second direction perpendicular to the first direction, within a same pad row in which the plurality of horizontal pads are horizontally arranged.

25 Claims, 13 Drawing Sheets

FLEXIBLE FILM, CIRCUIT BOARD ASSEMBLY INCLUDING THE SAME AND DISPLAY APPARATUS INCLUDING THE SAME

This patent application claims priority to Korean Patent Application No. 10-2016-0090089, filed on Jul. 15, 2016, and all the benefits accruing therefrom under 35 U.S.C. § 119, the content of which in its entirety is incorporated by reference.

BACKGROUND (1) Field

The present disclosure herein relates to a flexible film, a circuit board assembly and a display apparatus, and more particularly, to a flexible film capable of improving space usability of a pad forming space, a circuit board assembly having the flexible film, and a display apparatus having the circuit board assembly.

(2) Description of the Related Art

In general, a display apparatus includes a display panel, a data driving unit and a gate driving unit which drives the display panel, and the like. The data driving unit, the gate driving unit and the like may be connected to the display panel by being mounted on the display panel in a form of a chip or mounted on a film.

Also, the display apparatus includes a circuit board disposed adjacent to the display panel to provide the data driving unit and the gate driving unit with various signals. The circuit board is electrically and mechanically connected to the display panel through a film.

SUMMARY

One or more exemplary embodiment of the present disclosure provides a flexible film having a pad disposition structure capable of improving usability of a given space of the flexible film.

One or more exemplary embodiment of the present disclosure also provides a circuit board assembly in which a circuit board has a lead disposition structure capable of improving usability of a given space of the circuit board and the above-mentioned flexible film is coupled to such circuit board.

One or more exemplary embodiment of the present disclosure also provides a display apparatus provided with the above-mentioned circuit board assembly.

An exemplary embodiment of the invention provides a flexible film including a base film including an edge portion which extends in a first direction, a plurality of wirings disposed on the base film, and a plurality of pads which is disposed in the edge portion of the base film and connected to the plurality of wirings.

The plurality of pads disposed in the edge portion include a plurality of horizontal pads horizontally arranged in the first direction to define a pad row extended in the first direction; and a vertical pad including a plurality of vertically arranged pads arranged in a second direction perpendicular to the first direction, within a same pad row in which the plurality of horizontal pads are horizontally arranged.

In an exemplary embodiment of the invention, a circuit board assembly includes a circuit board which provides a signal and a flexible film which is attached to the circuit board and receives the signal therefrom. The flexible film includes a base film including an edge portion which extends in a first direction, a plurality of wirings provided on the base film, and a plurality of pads which is disposed in the edge portion of the base film and connected to the plurality of wirings.

The plurality of pads disposed in the edge portion includes a plurality of horizontal pads horizontally arranged in the first direction to define a pad row extended in the first direction; and a vertical pad including a plurality of vertically arranged pads arranged in a second direction perpendicular to the first direction, within a same pad row in which the plurality of horizontal pads are horizontally arranged.

In an exemplary embodiment of the invention, a display apparatus includes a display panel which generates and displays an image with a signal provided thereto, a circuit board which provides the signal, and a flexible film which is attached to the display panel and the circuit board and through which the signal passes from the circuit board to the display panel. The flexible film includes a base film including an edge portion which extends in a first direction, a plurality of wirings disposed on the base film, and a plurality of pads which is disposed in the edge portion of the base film and connected to the plurality of wirings.

The plurality of pads disposed in the edge portion include a plurality of horizontal pads horizontally arranged in the first direction to define a pad row extended in the first direction; and a vertical pad comprising a plurality of vertically arranged pads arranged in a second direction perpendicular to the first direction, within a same pad row in which the plurality of horizontal pads are horizontally arranged.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain principles of the invention. In the drawings.

DETAILED DESCRIPTION

Figure 1:
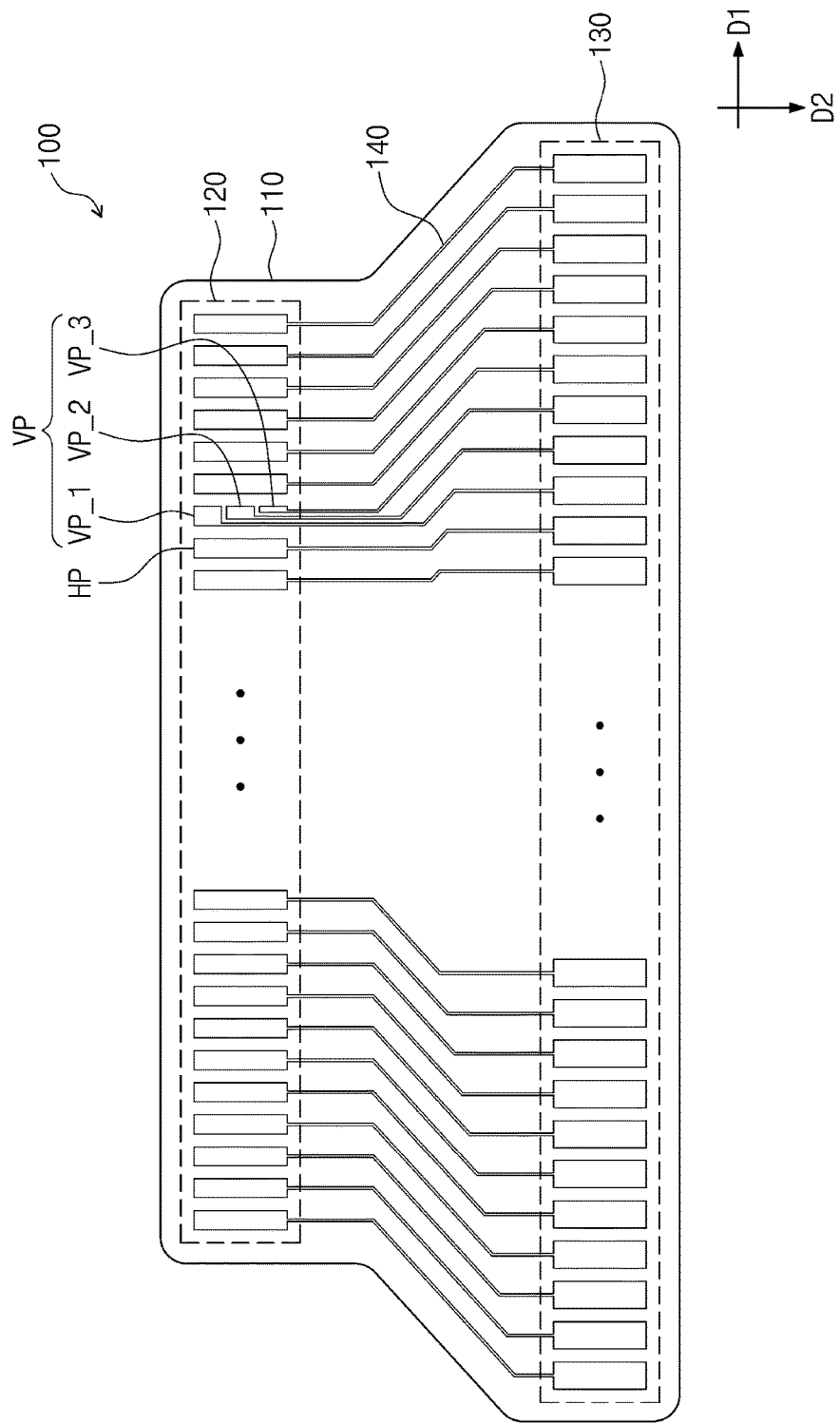
FIG. 1 is a top plan view illustrating an exemplary embodiment of a flexible film according to the invention.

Hereinafter, exemplary embodiments of the invention will be described in more detail with reference to the accompanying drawings.

The objects, means to solve the objects, and effects of the present disclosure will be readily understood through embodiments related to the accompanying drawings. Each figure may be partly simplified or exaggerated for clarity of illustration.

In assigning reference numerals to components in each drawing, it should be noted that like reference numerals refer to like components whenever possible even when indicated in different drawings. Moreover, detailed descriptions related to well-known functions or configurations will be ruled out in order not to unnecessarily obscure subject matters of the present disclosure.

It will be understood that when an element is referred to as being "on" another element, it can be directly on the other element or intervening elements may be present therebetween. In contrast, when an element is referred to as being "directly on" another element, there are no intervening elements present. It will be understood that "connected," "coupled," "attached" and the like may indicate a physical and/or electrical relationship between components described thereby.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As display panels used in display apparatuses become relatively large-sized and have an increased resolution, the numbers of films, circuit boards, and respective pads and leads provided in the display panel to be connected to the films and circuit boards, are increased. However, due to problems of miniaturization and production costs of the display panels and display apparatuses, there is a limitation in increasing the sizes of the films and the circuit boards.

Figure 2:
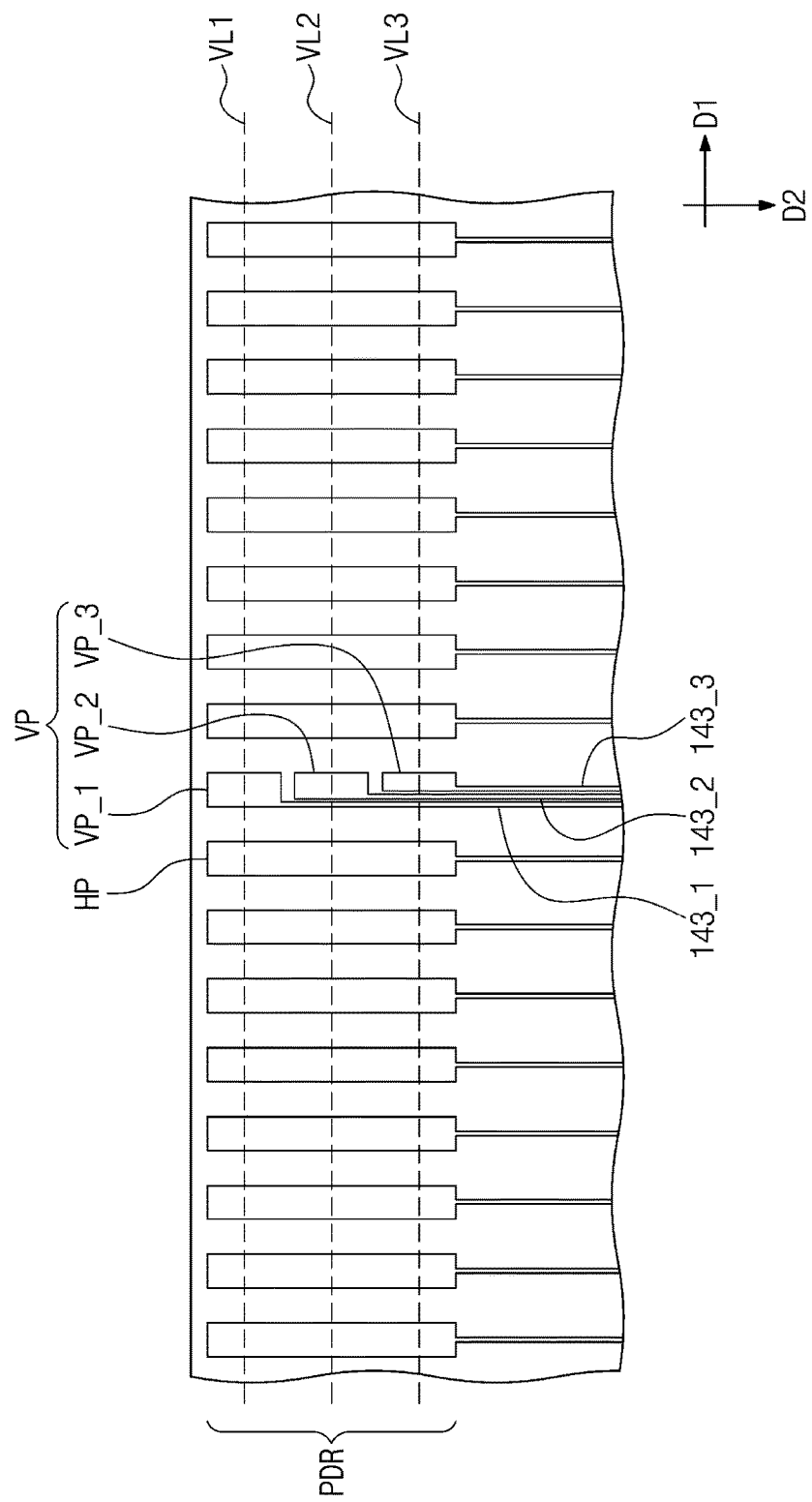
FIG. 2 is a partial enlarged top plan view of a pad structure of the flexible film illustrated in FIG. 1.

FIG. 1 is a top plan view illustrating an exemplary embodiment of a flexible film according to the invention, and FIG. 2 is a partial enlarged top plan view of a pad structure of the flexible film illustrated in FIG. 1.

Referring to FIG. 1, an exemplary embodiment of a flexible film 100 according the invention includes a base film 110, a wiring 140 disposed in plural on the base film 110, and a plurality of pads 120 and 130 respectively connected to the plurality of wirings 140.

Each of the plurality of pads 120 and 130 include a pad HP provided in plurality and horizontally arranged and a vertical pad VP as a collection of a plurality of vertically arranged pads or sub-pads (hereinafter generally referred to as "a plurality of vertically arranged pads"). The horizontally arranged pads HP are arranged in a first direction D1 to define a pad row. The plurality of vertically arranged pads within the vertical pad VP are arranged in a second direction D2 perpendicular to the first direction D1 in the same pad row. A pad row is respectively indicated by the dotted line boxes for the plurality of pads 120 and 130 in FIG. 1.

In FIG. 1, for a same pad row (dotted line box 120), a maximum pad length (e.g., length of HP) extending in a second direction D2 perpendicular to the first direction D1, among the plurality of pads (HP, VP_1, VP_2 and VP_3) in the same pad row, defines a boundary of the same pad row in the second direction (e.g., at least between horizontal dotted lines of box 120). Within the boundary in the second direction of the same pad row (e.g., between horizontal dotted lines), the plurality of pads includes: a plurality of horizontal pads HP horizontally arranged in the first direction D1, and a vertical pad VP disposed among the horizontal pads HP and including a plurality of vertically arranged pads VP_1, VP_2 and V_3 (arranged in the second direction D2.

The plurality of pads 120 and 130 include a plurality of input side pads 120 for receiving signals from outside the flexible film 100 and a plurality of output side pads 130 for outputting the signals outside the flexible film 100. Here, at least one of the input side pads or output side pads may include the plurality of horizontally arranged pads HP and the vertical pad VP including the plurality of vertically arranged pads. Specifically, the input side pads 120 may include the plurality of horizontally arranged pads HP and the vertical pad VP including the plurality of vertically arranged pads, or the output side pads 130 may include the plurality of horizontally arranged pads HP and the vertical pad VP including the plurality of vertically arranged pads. Alternatively, each of the input side pads 120 and the output side pads 130 may include the plurality of horizontally arranged pads HP and the vertical pad VP including the plurality of vertically arranged pads.

The plurality of wirings 140 may be respectively provided between the plurality of input side pads 120 and the plurality of output side pads 130 and may thereby electrically connect corresponding input side pads 120 and output side pads 130 to each other in the flexible film 100.

Referring to FIG. 2, the plurality of horizontally arranged pads HP are arranged in the first direction D1 to define one pad row PDR. The plurality of vertically arranged pads within a same vertical pad VP are arranged in the second direction D2 within the same pad row PDR. In an exemplary embodiment of the invention, the plurality of vertically arranged pads within the vertical pad VP include a first pad (or sub-pad) VP_1, a second pad (or sub-pad) VP_2 and a third pad (or sub-pad) VP_3 vertically arranged within the same vertical pad VP. The first through third pads VP_1 to VP-3 may be otherwise referred to as a first vertically arranged pad VP_1, a second vertically arranged pad VP_2 and a third vertically arranged pad VP_3.

Within a same pad row PDR, the first vertically arranged pad VP_1 is disposed on a first virtual line VL1 extending in the first direction D1, and the second vertically arranged pad VP_2 is disposed on a second virtual line VL2 parallel to the first virtual line VL1. With reference to an outer edge of the flexible film 100 extending in the first direction D1, the second virtual line VL2 is disposed further inside the flexible film 100 than the first virtual line VL1. Within the same pad row PDR, the third vertically arranged pad VP_3 is disposed on a third virtual line VL3 parallel to the first and second virtual lines VL1 and VL2. With reference to the same outer edge of the flexible film 100 extending in the first direction D1, the third virtual line VL3 is disposed further inside the flexible film 100 than the second virtual line VL2. The first to third virtual lines VL1 to VL3 may indicate first to third pad sub-row within the same pad row PDR.

Here, the horizontally arranged pads HP are respectively disposed to overlap each of the first to third virtual lines VL1 to VL3 within a same pad row PDR. However, the first vertically arranged pad VP_1 is disposed not to overlap the second and third virtual lines VL2 and VL3, and the second vertically arranged pad VP_2 is disposed not to overlap the first and third virtual lines VL1 and VL3, within a same pad row PDR. Also, within the same pad row PDR, the third vertically arranged pad VP_3 is disposed not to overlap the first and second virtual lines VL1 and VL2.

The collective vertical pad VP defines a length thereof which is larger than a width thereof. In the top plan view, the length of the vertical pad VP may be a maximum overall dimension of the vertical pad VP and the width of the overall vertical pad VP may be a minimum overall dimension of the vertical pad VP. The pad HP may define a length thereof which is larger than a width thereof. In the top plan view, the length may be a maximum dimension of the pad HP and the width may be a minimum dimension of the pad HP.

The overall length of each vertical pad VP in the second direction D2 is smaller than the overall length of each of the horizontally arranged pads HP in the second direction D2. The maximum overall length of each vertical pad VP in the second direction D2 is smaller than or equal to the minimum overall length of each of the horizontally arranged pads HP in the second direction D2. In an exemplary embodiment, the length of each of the horizontally arranged pads HP in the second direction D2 may be greater than at least two times the overall length of at least one (for example, the first vertically arranged pad VP_1) within the vertical pad VP in the second direction D2.

On the base film 110, a plurality of individual pad areas are defined in which one or more pad (among the vertical and horizontally arranged pads) is disposed. The individual pad areas are arranged spaced apart from each other in the first direction D1 within a single pad row.

In an exemplary embodiment, a maximum width among the widths of the plurality of pads (the vertical and horizontally arranged pads) arranged in the single pad row may define a maximum width of each individual pad area among the plurality of individual pad areas of the base film 110 arranged in a single line in the single pad row. The plurality of pads (the vertical and horizontally arranged pads) arranged in the single pad row may include at least one pad (VP) for which a plurality of sub-pads (VP_1, VP_2 and VP_3) are arranged spaced apart from each other in the second direction D2 within the maximum width of the individual pad area. A total number of the pads (among the vertical and horizontally arranged pads) arranged in the single pad row is greater than a number of the plurality of individual pad areas of the base film 110 defined by the maximum width among the widths of the plurality of pads.

In another exemplary embodiment, a planar area of each individual pad in a single pad row may define a pad area of the base film 110 in the single pad row. The pad areas are arranged spaced apart from each other in the first direction within the single pad row. For the plurality of pads arranged in the single pad row, a total number of the pads arranged in the single line is smaller than a number of the plurality of individual pad areas in the single pad row.

The width of each of the vertically arranged pads VP_1, VP_2 and VP_3 within the vertical pad VP in the first direction D1 is less than the width of each of the horizontally arranged pads HP in the first direction D1 within a same pad row PDR. In an exemplary embodiment of the invention among the vertically arranged pads VP_1, VP_2 and VP_3 within the vertical pad VP, the first vertically arranged pad VP_1 is located outermost (e.g., closest to the outer edge of the flexible film 100) and may have the same width as the horizontally arranged pads HP in the pad row PDR. However, the second and third vertically arranged pads VP_2 and VP_3 which are disposed further inside the flexible film 100 as compared to the first vertically arranged pad VP_1 may have widths smaller than that of the horizontally arranged pads HP and the first vertically arranged pad VP 1. Also, the third vertically arranged pad VP_3 which is further inside the flexible film 100 as compared to the second vertically arranged pad VP_2 may have a width smaller than the second vertically arranged pad VP_2.

FIG. 2 illustrates the widths of the first to third vertically arranged pads VP_1 to VP_3 are decreased as the pads are located further inside the flexible film 100, but the invention is not limited thereto. That is, the first to third vertically arranged pads VP_1 to VP_3 may also have the same width as each other.

The plurality of wirings 140 include a first vertically arranged wiring 143_1 connected to the first vertically arranged pad VP_1, a second vertically arranged wiring 143_2 connected to the second vertically arranged pad VP_2, and a third vertically arranged wiring 143_3 connected to the third vertically arranged pad VP_3. In the top plan view, the first vertically arranged wiring 143_1 crosses the second virtual line VL2 on which the second vertically arranged pad VP_2 is located and the third virtual line VL3 on which the third vertically arranged pad VP_3 is located, and then further extends in the second direction D2 to be connected to the first vertically arranged pad VP_1. At the second virtual line VL2, the first vertically arranged wiring 143_1 may be disposed spaced apart a predetermined distance in the first direction D1 from the second vertically arranged pad VP_2. The first to third vertically arranged wirings 143_1 to 143_3 may be considered as directly connected to the first to third vertically arranged pads VP_1 to VP_3, but the invention is not limited thereto.

In similar manner, the second vertically arranged wiring 143_2 crosses the third virtual line VL3 on which the third vertically arranged pad VP_3 is located and then further extends in the second direction D2 to be connected to the second vertically arranged pad VP_2. At the third virtual line VL3, the second vertically arranged wiring 143_2 may be disposed spaced apart a predetermined distance in the first direction D1 from the third vertically arranged pad VP_3.

FIG. 2 illustrates both the first and second vertically arranged wirings 143_1 and 143_2 are disposed to the left of the second and third vertically arranged pads VP_2 and VP_3, but the invention is not limited thereto. That is, when the first vertically arranged wiring 143_1 is disposed to the left of the second and third vertically arranged pads VP_2 and VP_3, the second vertically arranged wiring 143_2 may also be disposed to the right of the second and third vertically arranged pads VP_2 and VP_3.

Also, FIG. 2 illustrates the plurality of vertically arranged pads within the collective vertical pad VP include three vertically arranged pads VP_1, VP_2 and VP_3, but the invention is not limited thereto.

Figure 3:
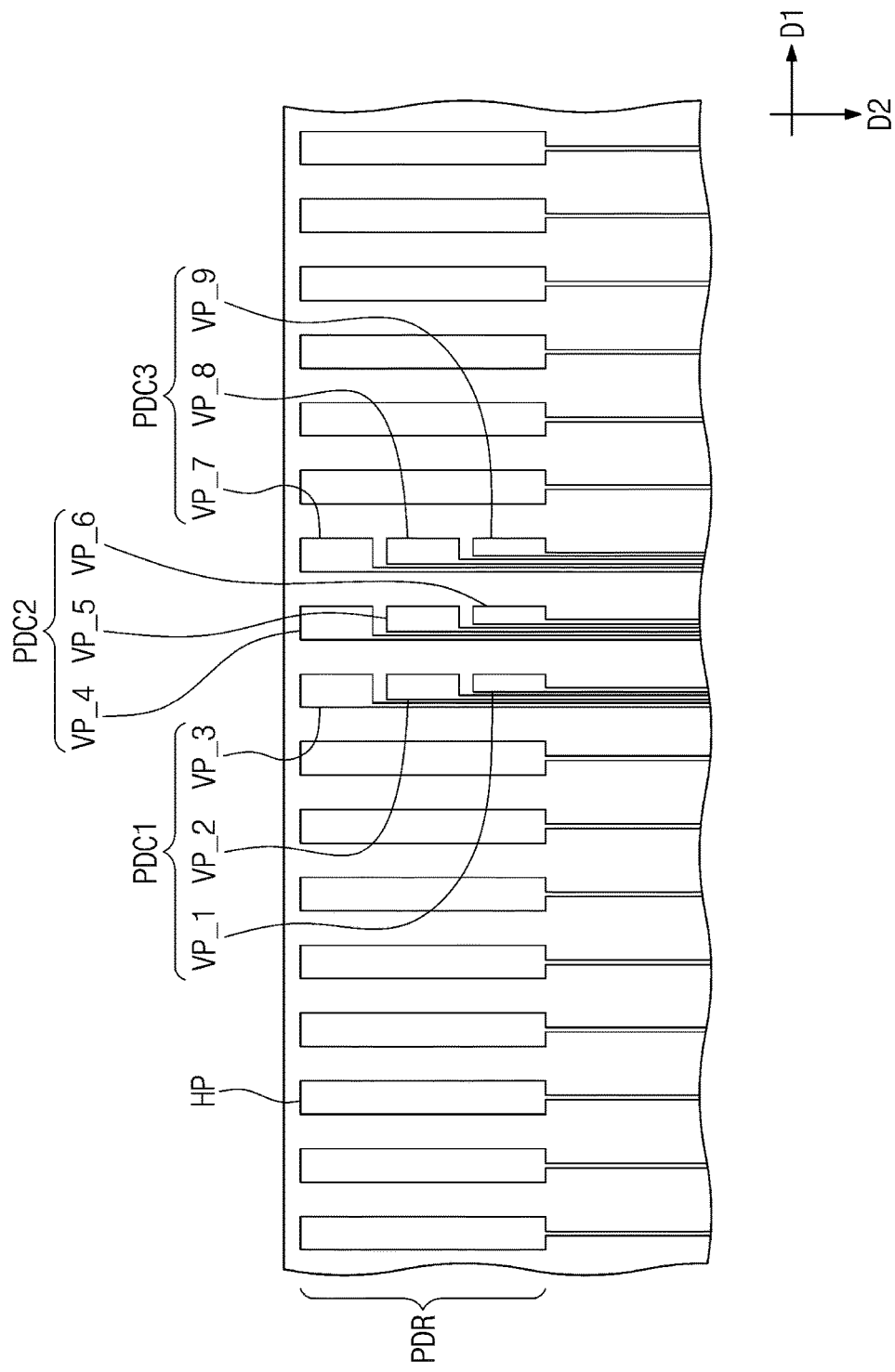
FIG. 3 is an enlarged top plan view illustrating a modified exemplary embodiment of a pad structure of the flexible film illustrated in FIG. 1 according to the invention.

FIG. 3 is an enlarged top plan view illustrating a modified exemplary embodiment of a pad structure of the flexible film illustrated in FIG. 1 according to the invention. Here, from among the components illustrated in FIG. 3, the same components as those illustrated in FIG. 2 are referred to as the same reference symbols and the detailed description thereof will not be provided.

Referring to FIG. 3, a pad HP is provided in plurality and horizontally arranged in a first direction D1 (hereinafter referred to as "a plurality of horizontally arranged pads HP") to define one pad row PDR. A plurality of vertically arranged pads are arranged in a second direction D2 in the pad row PDR, to respectively define a plurality of pad columns. FIG. 3 illustrates, as an exemplary embodiment of the invention, a structure in which a collection or group of vertically arranged pads define first to third pad columns PDC1, PDC2 and PDC3.

In an exemplary of the invention, the first pad column PDC1 includes a first vertically arranged pad VP_1, a second vertically arranged pad VP_2 and a third vertically arranged pad VP_3, the second pad column PDC2 includes a fourth vertically arranged pad (or sub-pad) VP_4, a fifth vertically arranged pad (or sub-pad) VP_5 and a sixth vertically arranged pad (or sub-pad) VP_6, and the third pad column PDC3 includes a seventh vertically arranged pad (or sub-pad) VP_7, an eighth vertically arranged pad (or sub-pad) VP_8 and a ninth vertically arranged pad (or sub-pad) VP_9.

FIG. 3 illustrates three vertically arranged pads are disposed within each of the pad columns PDC1 to PDC3, but the invention is not limited thereto. That is, the number and the sizes of the vertically arranged pads disposed within each of the pad columns PDC1 to PDC3 may differ according to the characteristics of signals which the pads receive. Also, among the plural pad columns, for each pad column, a different number of vertically arranged pads may be provided.

FIG. 3 illustrates, the number of pad columns PDC1 to PDC3 within the flexible film 100 is three, but the number of pad columns of the flexible film 100 may be expanded to more than three.

The above discussion regarding the lengths and widths of the plurality of horizontally arranged pads HP and the plurality of vertically arranged pads of FIG. 2 may be applied to those pads of the structure illustrated in FIG. 3. The above discussion regarding the wirings relative to the pads in FIG. 2 may also be applied to the structure illustrated in FIG. 3.

Figure 4:
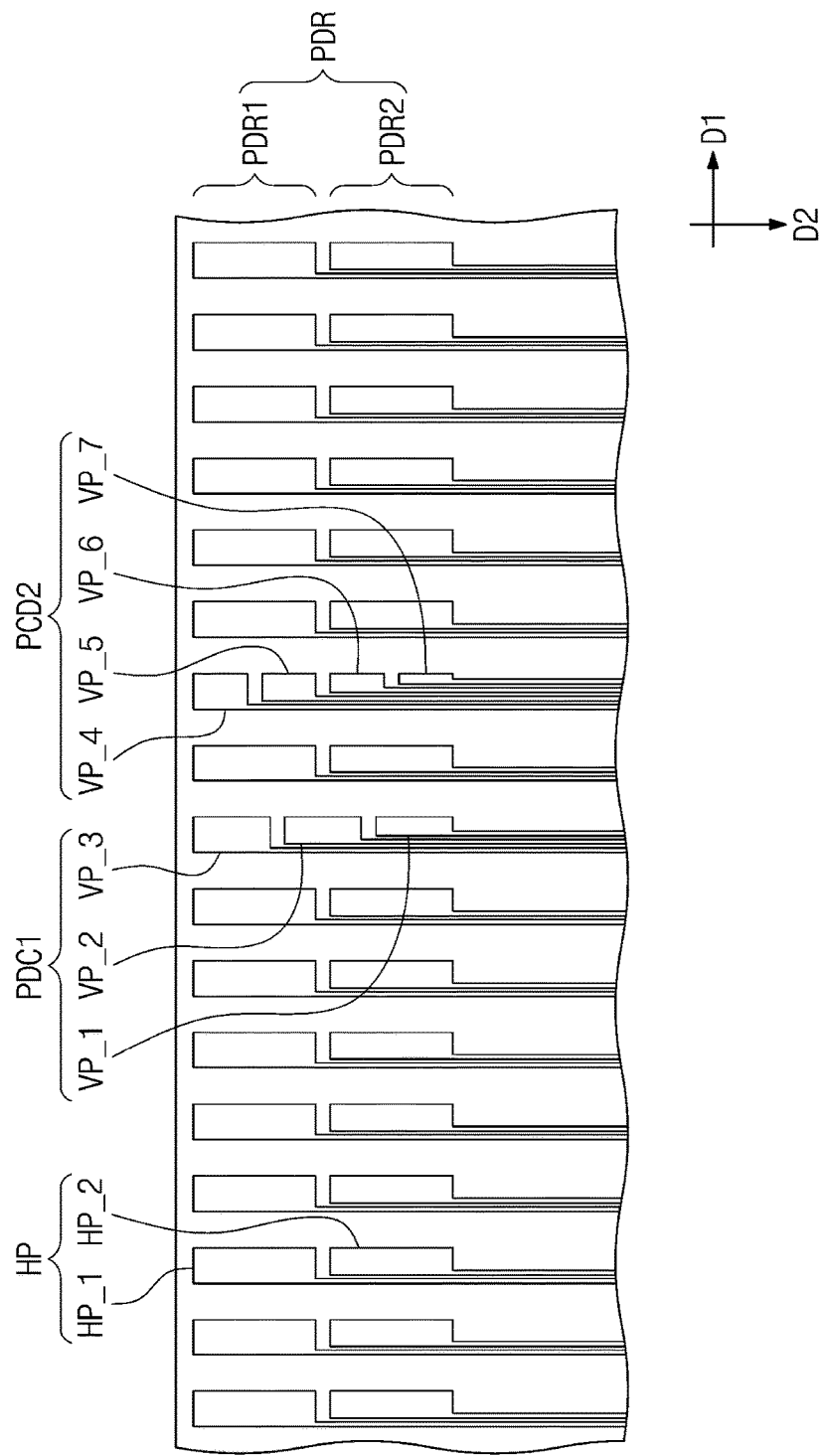
FIG. 4 is an enlarged top plan view illustrating still another modified exemplary embodiment of a pad structure of the flexible film illustrated in FIG. 1 according to the invention.

FIG. 4 is an enlarged top plan view illustrating still another modified exemplary embodiment of a pad structure of the flexible film illustrated in FIG. 1 according to the invention. Here, from among the components illustrated in FIG. 4, the same components as those illustrated in FIG. 2 are referred to as the same reference symbols and the detailed description thereof will not be provided.

A collective pad HP may be arranged in a first direction D1 in a same pad row PDR and may be otherwise referred to as "a plurality of horizontally arranged pads HP". Each collective pad HP may include vertically arranged pads (or sub-pads) thereof. The vertically arranged pads of a collective pad HP may thereby be disposed in a plurality of sub-pad rows (which may be otherwise collectively referred to as "a plurality of pad rows PDR"). FIG. 4 illustrates, as an exemplary embodiment of the invention, a structure in which the plurality of pad rows PDR collectively include first and second pad rows PDR1 and PDR2.

In at least one of the plurality of pad rows PDR1 and PDR2, a plurality of vertically arranged pads may be provided. In another exemplary embodiment, the plurality of vertically arranged pads may be respectively distributed to be divided into the two pad rows PDR1 and PDR2.

Referring to FIG. 4, each of the plurality of horizontally arranged pads HP includes a plurality of first horizontally arranged pads (or sub-pads) HP_1 disposed arranged in the first direction D1 within the first pad row PDR1, and a plurality of second horizontally arranged pads (or sub-pads) HP_2 disposed arranged in the first direction D1 within the second pad row PDR2.

With respect to an end portion of the base film 110 (e.g., outer edge) located at the input side of the flexible film 100, the second pad row PDR may be located further inside the flexible film 100 than the first pad row PDR1. In an exemplary embodiment of the invention, the widths of the first horizontally arranged pads HP_1 in the first direction D1 may be greater than the widths of the second horizontally arranged pads HP_2 in the first direction D1. However, the invention is not limited thereto. That is, in another exemplary, the widths of the first horizontally arranged pads HP_1 and the second horizontally arranged pads HP_2 in the first direction D1 may be the same.

A plurality of vertically arranged pads are arranged in a second direction D2 in the first and second pad rows PDR1 and PDR2 to define a plurality of pad columns. FIG. 4 illustrates, as an exemplary embodiment of the invention, a structure in which a collective group of the vertically arranged pads respectively defines first and second pad columns PDC1 and PDC2.

The first pad column PDC1 includes first to third vertically arranged pads VP_1, VP_2 and VP_3, and the second pad column PDC2 includes fourth to seventh vertically arranged pads VP_4, VP_5, and VP_6 and VP_7.

The first to third vertically arranged pads VP_1, VP_2 and VP_3 may be arranged in a second direction D2 and distributed to be disposed in the first and second pad rows PDR1 and PDR2. Specifically, the first vertically arranged pad VP_1 may be disposed to be located in the second pad row PDR2, and the third vertically arranged pads VP_1 may be disposed to be located in the first pad row PDR1, and the third vertically arranged pads VP_3 may be disposed to overlap both the first and second pad rows PDR1 and PDR2.

Also, the fourth to seventh vertically arranged pads VP_4, VP_5, VP_6 and VP_7 may be arranged in the second direction D2 and distributed to be disposed in the first and second pad rows PDR1 and PDR2. Specifically, the fourth and fifth vertically arranged pads VP_4 and VP_5 may be located in the first pad row PDR1, and the sixth and seventh vertically arranged pads VP_6 and VP_7 may be located in the second pad row PDR2.

Figure 5:
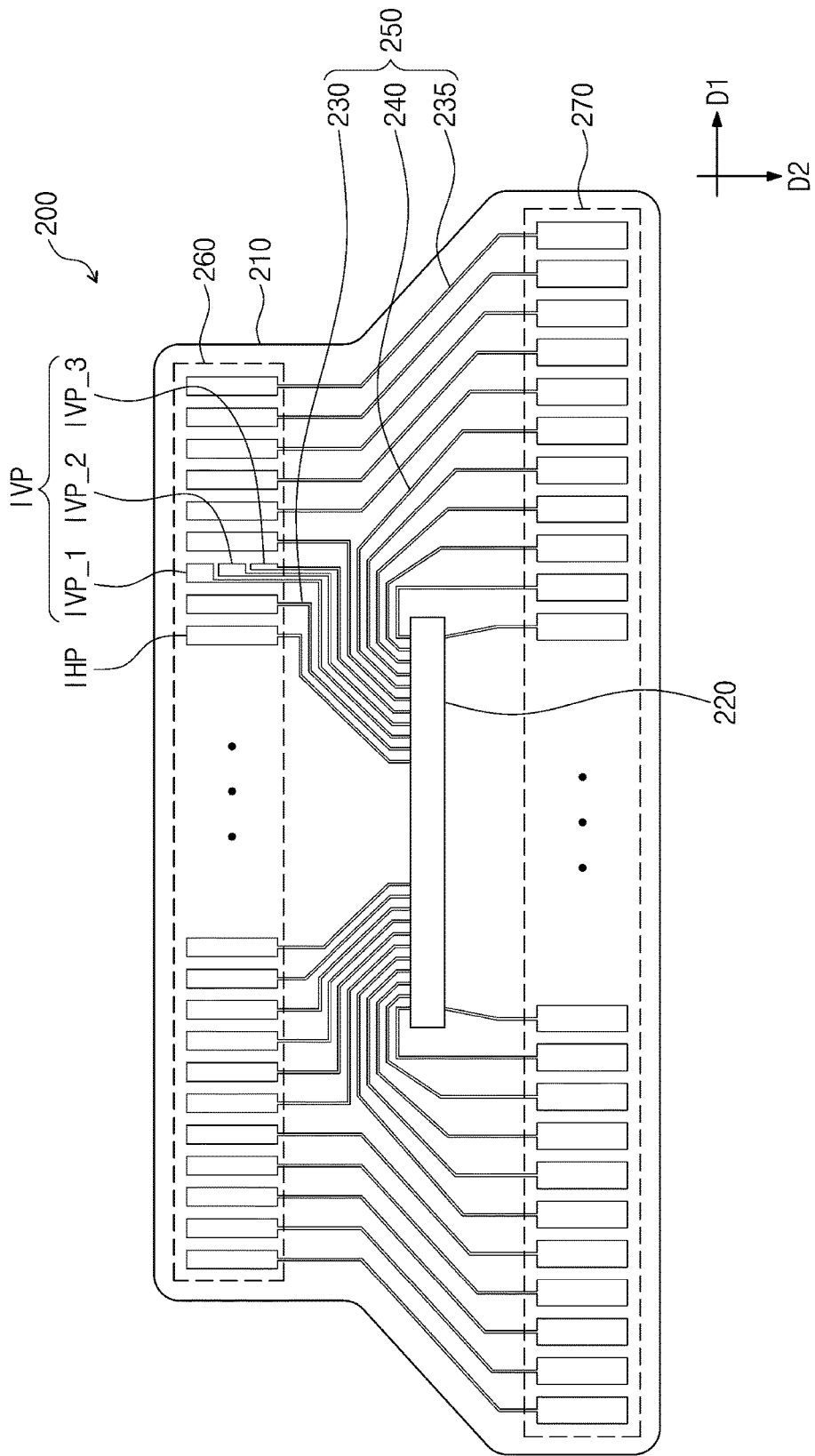
FIG. 5 is a top plan view illustrating another exemplary embodiment of a flexible film according to the invention.

FIG. 5 is a top plan view illustrating another exemplary embodiment of a flexible film according to the invention.

Referring to FIG. 5, an exemplary embodiment of a flexible film 200 according the invention includes a base film 210 provided with a mounting region in which a chip 220 is mounted on the base film 210, and a plurality of wirings 250 which is provided on the base film 210.

The plurality of wirings 250 include an input wiring 230 provided in plural on the base film 210 (hereinafter referred to as "a plurality of input wirings 230"), an output wiring 240 provided in plural on the base film 210 (hereinafter referred to as "a plurality of output wirings 240") and a connecting wiring 235 provided in plural on the base film 210 (hereinafter referred to as "a plurality of connecting wirings 235". In the top plan view, the plurality of input wirings 230 are disposed extended to a first side of the flexible film 200 with respect to the chip 220 to transmit signals inputted from outside the flexible film 200 to the chip 220. The plurality of output wirings 240 are disposed extended to a second side of the flexible film 200 with respect to the chip 220 to transmit signals outputted from the chip 220 to outside the flexible film 200. The plurality of connecting wirings 235 are the wiring for transmitting signals which do not pass through the chip 220 and are disposed outside the mounting region of the base film 210.

The flexible film 200 may further include a plurality of input pads 260 and a plurality of output pads 270. The plurality of input pads 260 are provided at an end portion (e.g., adjacent to an outer edge) of the flexible film 200 at the first side of the base film 210 and are respectively connected to first ends of the plurality of input wirings 230 and first ends of the plurality of connecting wirings 235. The plurality of output pads 270 are provided at an end portion of the flexible film 200 at the second side of the base film 210 and are connected to the second ends of the plurality of output wirings 240 and the plurality of connecting wirings 235.

The plurality of input pads 260 include a pad IHP provided in plural and arranged in a horizontal direction (hereinafter referred to as "a plurality of horizontally arranged pads IHP") and a pad IVP including a collection of vertically arranged pad (or sub-pads) (hereinafter referred to as "a plurality of vertically arranged pads IVP").

The horizontally arranged pads IHP are arranged in a first direction D1 to define one pad row (PDR in FIG. 3), and the vertically arranged pads of the pad IVP_are arranged in a second direction D2 within the same one pad row PDR. In an exemplary embodiment of the invention, the plurality of vertically arranged pads IVP include a first vertically arranged pad (or sub-pad) IVP_1, a second vertically arranged pad (or sub-pad) IVP_2 and a third vertically arranged pad (or sub-pad) IVP_3.

FIG. 5 illustrates a structure in which the first to third vertically arranged pads IVP_1, IVP_2 and IVP_3 are connected to the input wirings, but the invention is not limited thereto. That is, the first to third vertically arranged pads IVP_1, IVP_2 and IVP_3 may be the pads connected to the connecting wirings 235.

Also, the disposition structure of the plurality of input pads 260 is not limited to the structure of FIG. 5. That is, the plurality of input pads 260 may have a disposition structure illustrated in FIG. 4 or FIG. 5 and may be expanded to other disposition structures.

In an exemplary embodiment of the invention, the plurality of vertically arranged pads IVP may be collectively formed by vertically arranging a contact resistance measuring pad, a test pad, a repair pad, or the like from among the plurality of input pads 260 of the flexible film 200. Also, about 20% or more of the plurality of input pads 260 are formed as the plurality of vertically arranged pads IVP, and thus a pad forming space may be sufficiently obtained inside the flexible film of a given size even when the number of the pads is increased.

In particular, in a state in which the width of the flexible film 200 in the first direction D1 is constrained, when the number of the input pads 260 is increased, some of the input pads 260 may be arranged in the second direction D2. As such, usability of a limited space of the flexible film 200 may be improved.

Figure 6:
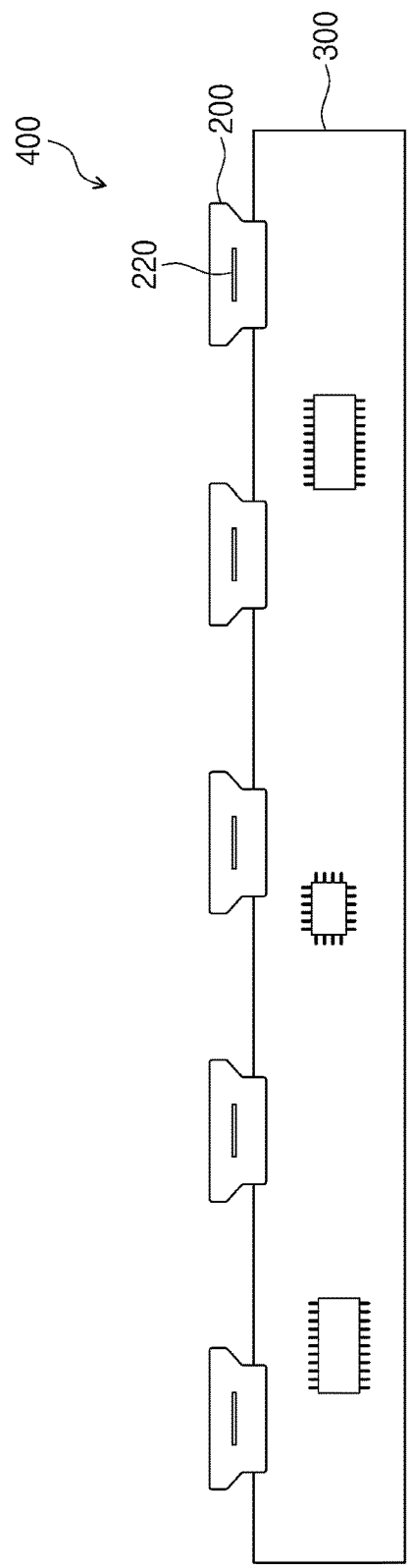
FIG. 6 is a top plan view illustrating an exemplary embodiment of a circuit board assembly including a flexible film according to the invention.
Figure 7:
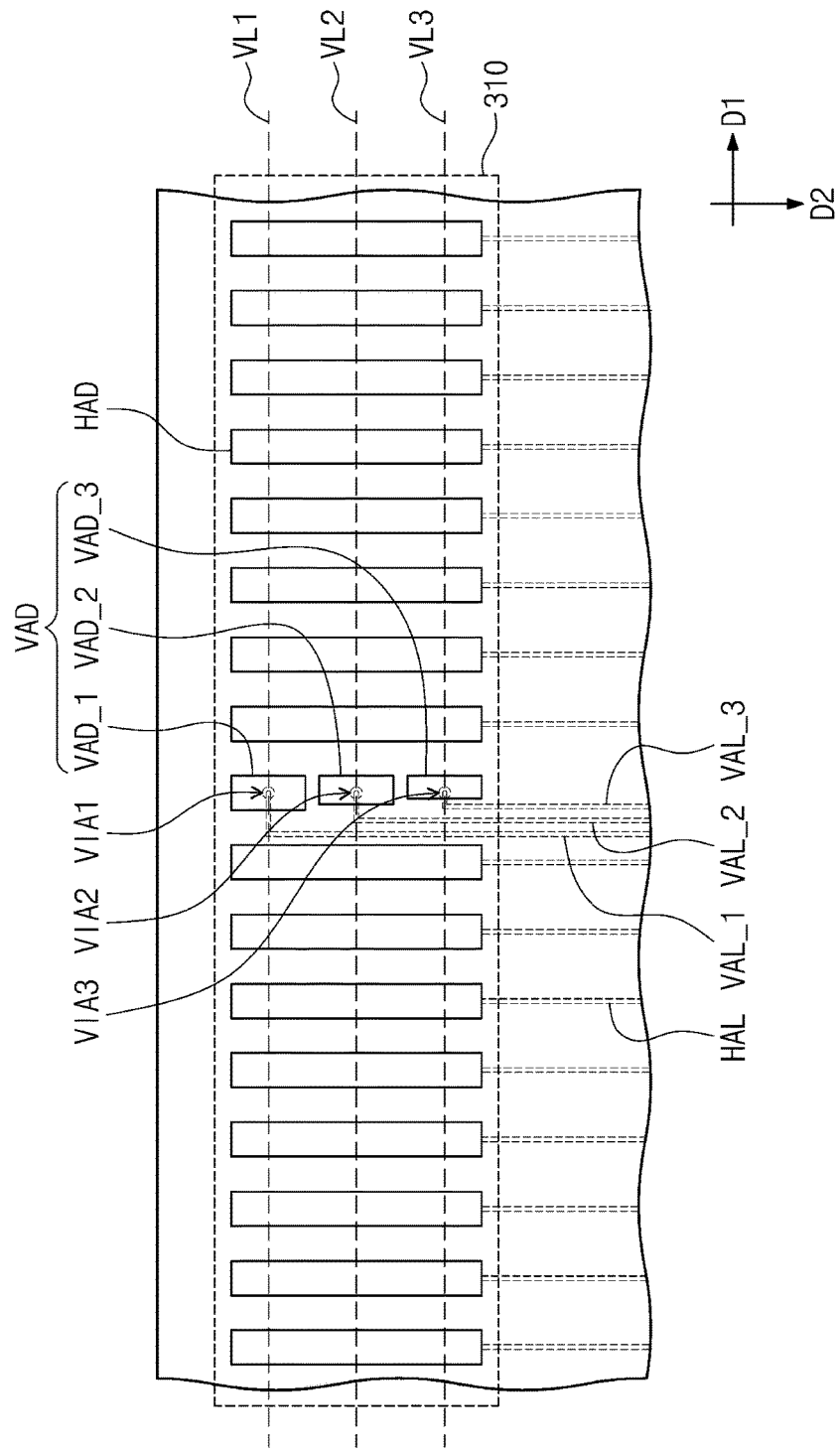
FIG. 7 is an enlarged top plan view illustrating a lead portion of the circuit board assembly illustrated in FIG. 6.

FIG. 6 is a top plan view illustrating an exemplary embodiment of a circuit board assembly including a flexible film according to the invention, and FIG. 7 is an enlarged top plan view illustrating a lead portion of the circuit board assembly illustrated in FIG. 6.

Referring to FIG. 6, a circuit board assembly 400 includes a circuit board 300 and a flexible film 200.

The flexible film 200 is attached to one side of the circuit board 300 at an outer edge thereof. Specifically, a first side of the flexible film 200 may be attached to the one side of the circuit board 300.

Since the flexible film 200 in FIG. 6 has the structure illustrated in FIG. 5, the detailed description about the flexible film 200 will not be provided. It is understood that the flexible film in FIG. 6 may also include the structures represented by the exemplary embodiments in FIGS. 1 to 4.

The circuit board 300 includes a plurality of leads 310 (shown in FIG. 7) which are configured to be connected to input pads 260 (shown in FIG. 5) of the flexible film 200. As illustrated in FIG. 7, the plurality of leads 310 include a lead HAD provided in plural and horizontally arranged (hereinafter referred to as "a plurality of horizontally arranged leads HAD") and a lead VAD including a collection of vertically arranged leads (or sub-leads) (hereinafter referred to as "a plurality of vertically arranged leads"). The plurality of horizontally arranged leads HAD correspond one to one to the plurality of vertically arranged leads VAD, and are arranged in a first direction D1 to define a lead row. The plurality of vertically arranged leads within the lead VAD are arranged in the second direction D2 in the pad row. The plurality of vertically arranged leads VAD of the circuit board 300 are disposed to correspond one to one to the plurality of vertically arranged pads IVP of the flexible film 200 (shown in FIG. 5).

As illustrated in FIG. 7, the plurality of vertically arranged leads VAD may include a first vertically arranged lead (or sub-lead) VAD_1, a second vertically arranged lead (or sub-lead) VAD_2 and a third vertically arranged lead (or sub-lead) VAD_3.

Within a same lead row PDR, the first vertically arranged lead VAD _1 is disposed on a first virtual line VL1 extending in the first direction D1, and the second vertically arranged lead VAD_2 is disposed on a second virtual line VL2 parallel to the first virtual line VL1, and the third vertically arranged lead VAD_3 is disposed on a third virtual line VL3 parallel to the first virtual line VL1.

The second virtual line VL2 is disposed further inside the circuit board 300 than the first virtual line VL1 with respect to the one side (e.g., the outer edge) of the circuit board 300 which extends in the first direction D1, and the third virtual line VL3 is disposed further inside the circuit board 300 than the second virtual line VL2 with respect to the one side of the circuit board 300.

Within a same lead row PDR, the horizontally arranged leads HAD are respectively disposed to overlap each of the first to third virtual lines VL1, VL2 and VL3. The first vertically arranged lead VAD_1 is disposed not to overlap the second and third virtual lines VL2 and VL3, and the second vertically arranged lead VAD_2 is disposed not to overlap the first and third virtual lines VL1 and VL3. Also, the third vertically arranged lead VAD_3 is disposed not to overlap the first and second virtual lines VL1 and VL2.

The circuit board 300 further includes a wiring HAL provided in plural and horizontally arranged in the first direction D1 (hereinafter referred to as "a plurality of horizontally arranged wirings HAL") connected to the plurality of horizontally arranged leads HAD, and a wiring VAL provided in plural and horizontally arranged in the first direction D1 (hereinafter referred to as "a plurality of vertically arranged wirings VAL") connected to the plurality of vertically arranged leads VAD.

The plurality of vertically arranged wirings VAL include a first vertically arranged wirings VAL_1 connected to the first vertically arranged lead VAD_1, a second vertically arranged wirings VAL_2 connected to the second vertically arranged lead VAD_2, and a third vertically arranged wirings VAL_3 connected to the third vertically arranged leads VAD_3.

The circuit board 300 may collectively include at least two sub circuit boards (not shown) arranged in a thickness direction of the circuit board 300, and the first to third vertically arranged wirings VAL_1, VAL_2 and VAL_3 and the first to third vertically arranged leads VAD_1, VAD_2 and VAD_3 are formed on sub circuit boards different from each other. Here, the first to third vertically arranged leads VAD_1, VAD_2 and VAD_3 may be brought into contact with the first to third vertically arranged wirings VAL_1, VAL_2 and VAL_3 at via holes VIA1, VIA2 and VIA3. The via holes VIA1, VIA2 and VIA3 may extend through a thickness of the circuit board 300 so as to be open at an upper surface and lower surface of the circuit board 300. Where the first to third vertically arranged leads VAD_1, VAD_2 and VAD_3 are disposed on one surface of the circuit board 300 (visible in FIG. 7), the corresponding first to third vertically arranged wirings VAL_1, VAL_2 and VAL_3 (dotted lines in FIG. 7) may be disposed on a surface of the circuit board 300 opposing the one surface (not visible in FIG. 7).

The first to third vertically arranged wirings VAL_1, VAL_2 and VAL_3 may be spaced apart a predetermined distance from each other to be electrically insulated from each other.

Also, in the top plan view, the first to third vertically arranged wirings VAL_1, VAL_2 and VAL_3 may be disposed at one side of the first to third vertically arranged leads VAD_1, VAD_2 and VAD_3 so as not to overlap the first to third vertically arranged leads VAD_1, VAD_2 and VAD_3. However, the invention is not limited thereto.

Similar to the above discussion for the pads of the flexible film, the collective lead VAD defines a length thereof which is larger than a width thereof. In the top plan view, the length of the overall lead VAD may be a maximum dimension of the lead VAD and the width of the overall lead VAD may be a minimum dimension of the lead VAD. The pad HAD may define a length thereof which is larger than a width thereof. In the top plan view, the length may be a maximum dimension of the lead HAD and the width may be a minimum dimension of the lead HAD.

Referring to FIG. 7, in the top plan view, the width of each of the individual first to third vertically arranged leads VAD_1, VAD_2 and VAD_3 in the first direction D1 may be different from each other. That is, the width of the first vertically arranged lead VAD_1 disposed outermost (e.g., closest to the outer edge of the circuit board 300) may be the largest, and the width of the third vertically arranged lead VAD_3 disposed innermost (e.g., furthest from the outer edge of the circuit board 300) may be the smallest.

Figure 8:
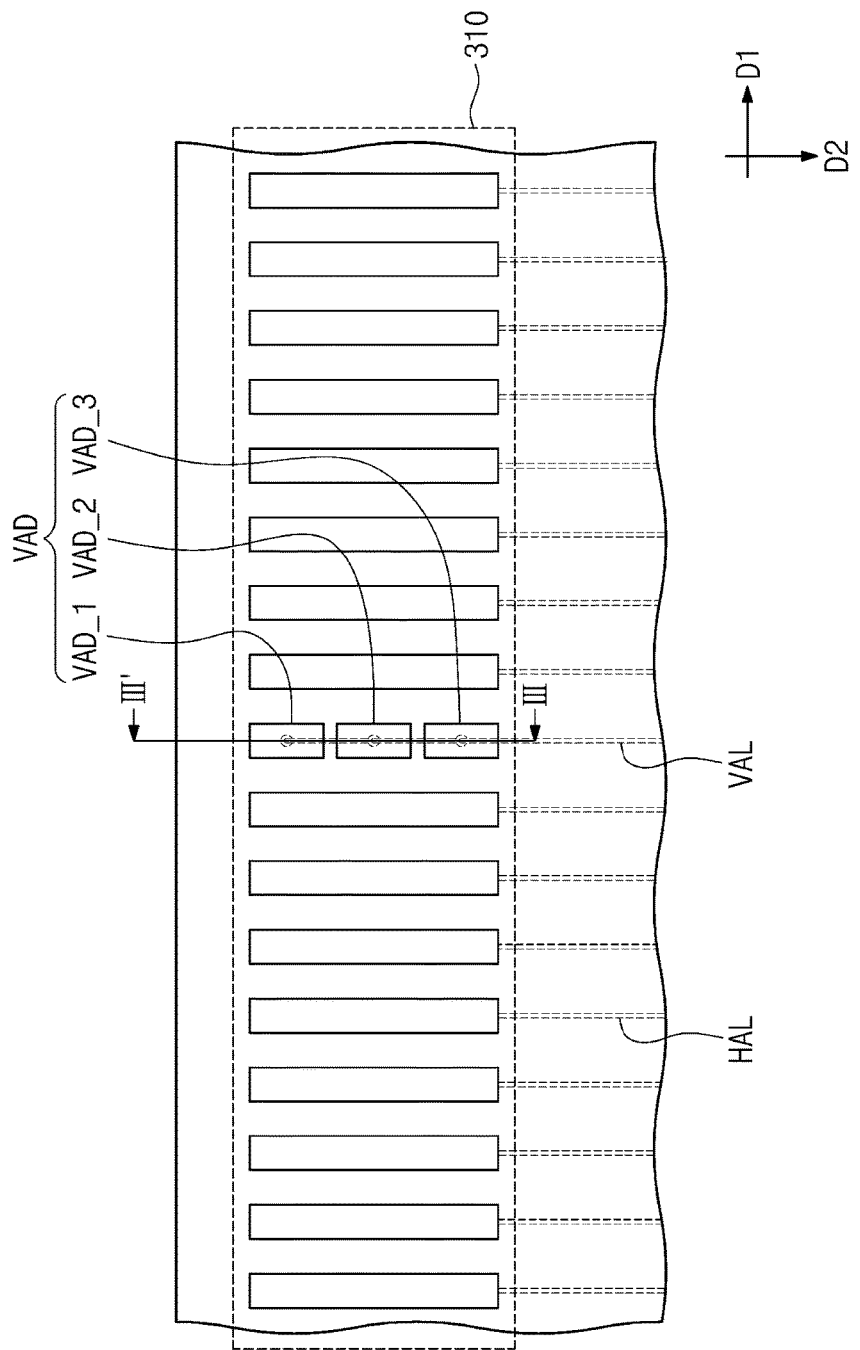
FIG. 8 is a top plan view illustrating a modified exemplary embodiment of a lead portion of the circuit board illustrated in FIG. 6 according to the invention.
Figure 9:
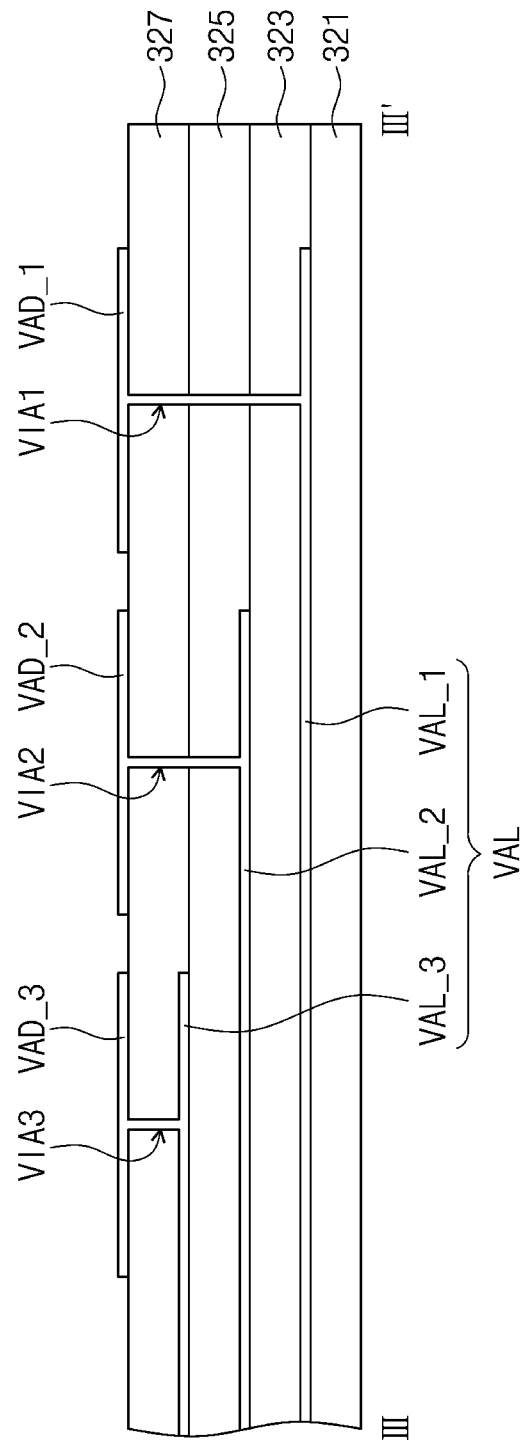
FIG. 9 is a cross-sectional view taken along line illustrated in FIG. 8.

FIG. 8 is a top plan view illustrating a modified exemplary embodiment of a lead portion of a circuit board according to the invention, and FIG. 9 is a cross-sectional view taken along line III-III' illustrated in FIG. 8.

Referring to FIGS. 8 and 9, a plurality of vertically arranged wirings VAL include a first vertically arranged wiring VAL_1 connected to a first vertically arranged lead VAD_1, a second vertically arranged wiring VAL_2 connected to a second vertically arranged lead VAD_2, and a third vertically arranged wiring VAL_3 connected to a third vertically arranged leads VAD_3.

The first to third vertically arranged wirings VAL_1, VAL_2 and VAL_3 may be disposed on layers different from each other, in a cross-sectional (e.g., thickness direction of the circuit board 300).

Specifically, the circuit board 300 may include first, second, third and fourth sub circuit boards 321, 323, 325 and 327 which are sequentially laminated. The first vertically arranged wiring VAL_1 is provided on the first sub circuit board 321, and the second vertically arranged wiring VAL_2 is provided on the second sub circuit board 323. The third vertically arranged wiring VAL_3 is provided on the third sub circuit board 325, and the first to third vertically arranged leads VAD_1, VAD_2 and VAD_3 are provided on the fourth sub circuit board 327.

The first vertically arranged wiring VAL_1 may overlap the first to third vertically arranged leads VAD_1, VAD_2 and VAD_3. The second vertically arranged wiring VAL_2 may overlap the second and third vertically arranged leads VAD_2 and VAD_3, and the third vertically arranged wiring VAL_3 may overlap the third vertically arranged leads VAD_3. However, the invention is not limited thereto.

The first vertically arranged wiring VAL_1 contacts the first vertically arranged lead VAD_1 through a first via hole VIA1, and the second vertically arranged wiring VAL_2 contacts the second vertically arranged leads VAD_2 through a second via hole VIA2, and the third vertically arranged wiring VAL_3 contacts the third vertically arranged leads VAD_3 through a third via hole VIA3.

In a top plan view, since the first to third vertically arranged wirings VAL_1, VAL_2 and VAL_3 are disposed on layers different from each other within the circuit board 300, the widths of the first to third vertically arranged leads VAD_1, VAD_2 and VAD_3 in the first direction D1 may be the same as each other and may overlap each other.

Figure 10:
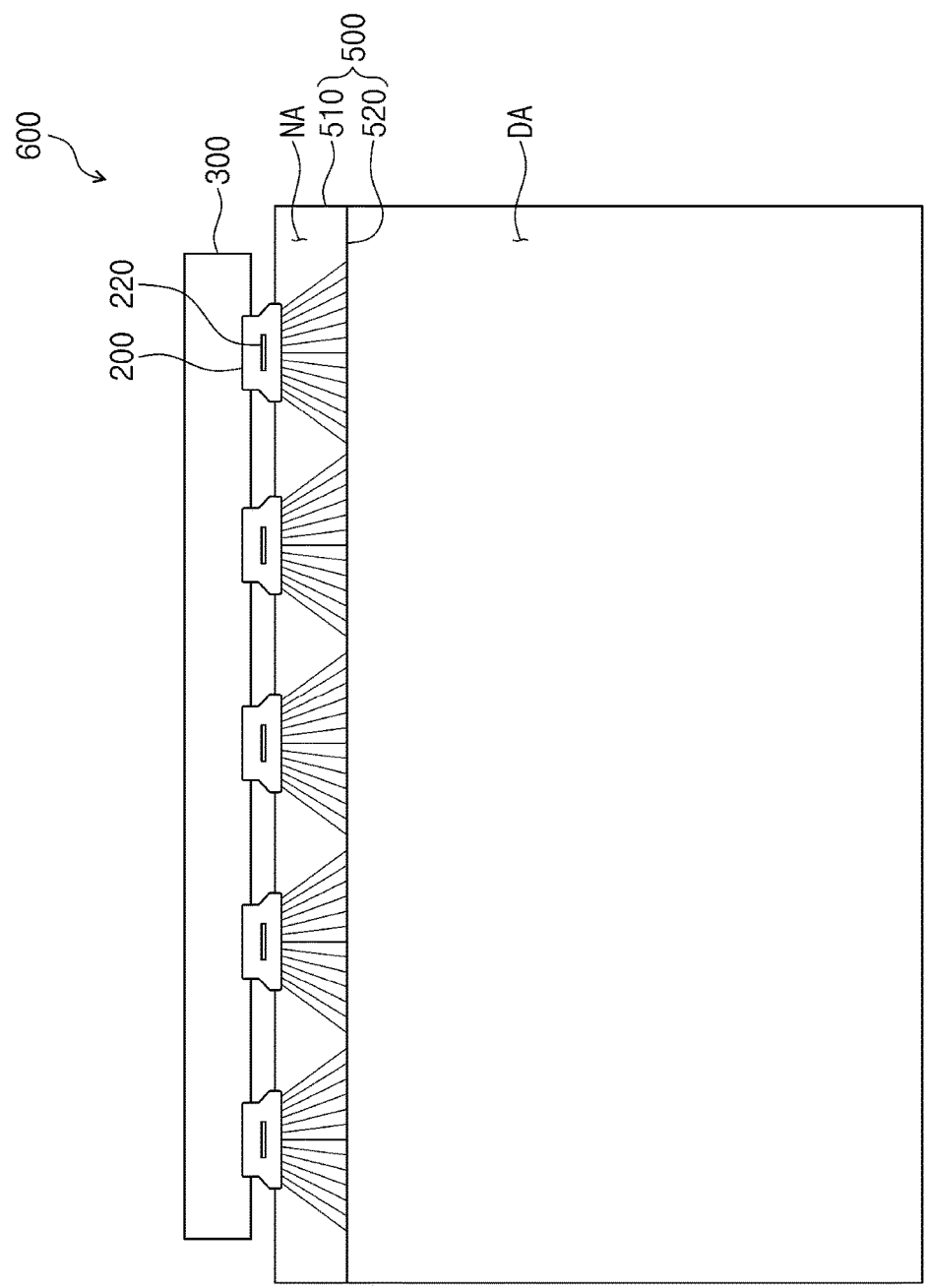
FIG. 10 is a top plan view of an exemplary embodiment of a display apparatus including a display panel according to the invention.

FIG. 10 is a top plan view of an exemplary embodiment of a display apparatus including a display panel according to the invention.

Referring to FIG. 10, an exemplary embodiment of a display apparatus 600 according to the invention may include a display panel 500 which generates and displays an image, and a circuit board assembly collectively including a flexible film 200 and a circuit board 300 attached to one side of the display panel 500. The circuit board assembly in FIG. 10 may have the same configuration as the circuit board assembly 400 illustrated in FIG. 6.

In the top plan view, the display panel 500 may include as a display region DA and a non-display region NA. The display region DA may be a region in which the image is displayed, and the non-display region NA may be a region in which no image is displayed. The non-display region NA may be disposed adjacent to the display region DA. The display region DA and the non-display region NA may define an entirety of the display panel 500 in the top plan view.

The display panel 500 may include a lower display substrate 510, an upper display substrate 520, and an optical medium (not shown) interposed between the lower display substrate 510 and the upper display substrate 520. The optical medium may include a liquid crystal layer, but is not limited thereto. In FIG. 10, an example in which the display panel 500 is a liquid crystal display panel is described, but the invention is not limited thereto.

In an exemplary embodiment, for example, the display panel 500 may be an organic light emitting display panel, a liquid crystal display panel, a plasma display panel, an electrophoretic display panel, a microelectromechanical system ("MEMS") display panel, and an electrowetting display panel, or the like. The optical medium (if any) corresponds to the respective display panel type.

Also, at least one of the lower and upper display substrates 510 and 520 may include or be formed of a flexible material such as polyimide.

FIG. 10 exemplarily illustrates that the non-display region NA is disposed adjacent to one side edge of the display region DA. However, the invention is not limited thereto, and the non-display region NA may be defined adjacent to one or more of other side edges of the display region DA.

In the non-display region NA, the display panel 500 may be connected to the flexible film 200, and the display panel 500 may receive signals required for an operation thereof through the flexible film 200.

A chip 220 may be mounted on the flexible film 200. A data driving circuit for supplying a data signal to the display panel 500 may be incorporated in the chip 220. The flexible film 200 supplies the data signal to the display panel 500.

The flexible film 200 may transmit a test signal, a contact resistance measuring signal, a repair signal or the like besides the data signal toward the display panel 500, and may transmit a control signal or the like. In an exemplary embodiment, for example, when a gate driving circuit (not shown) for supplying a gate signal to the display panel 500 is incorporated in the display panel 500, the control signal supplied to the gate driving circuit may be supplied to the display panel 500 through the flexible film 200.

Figure 11:
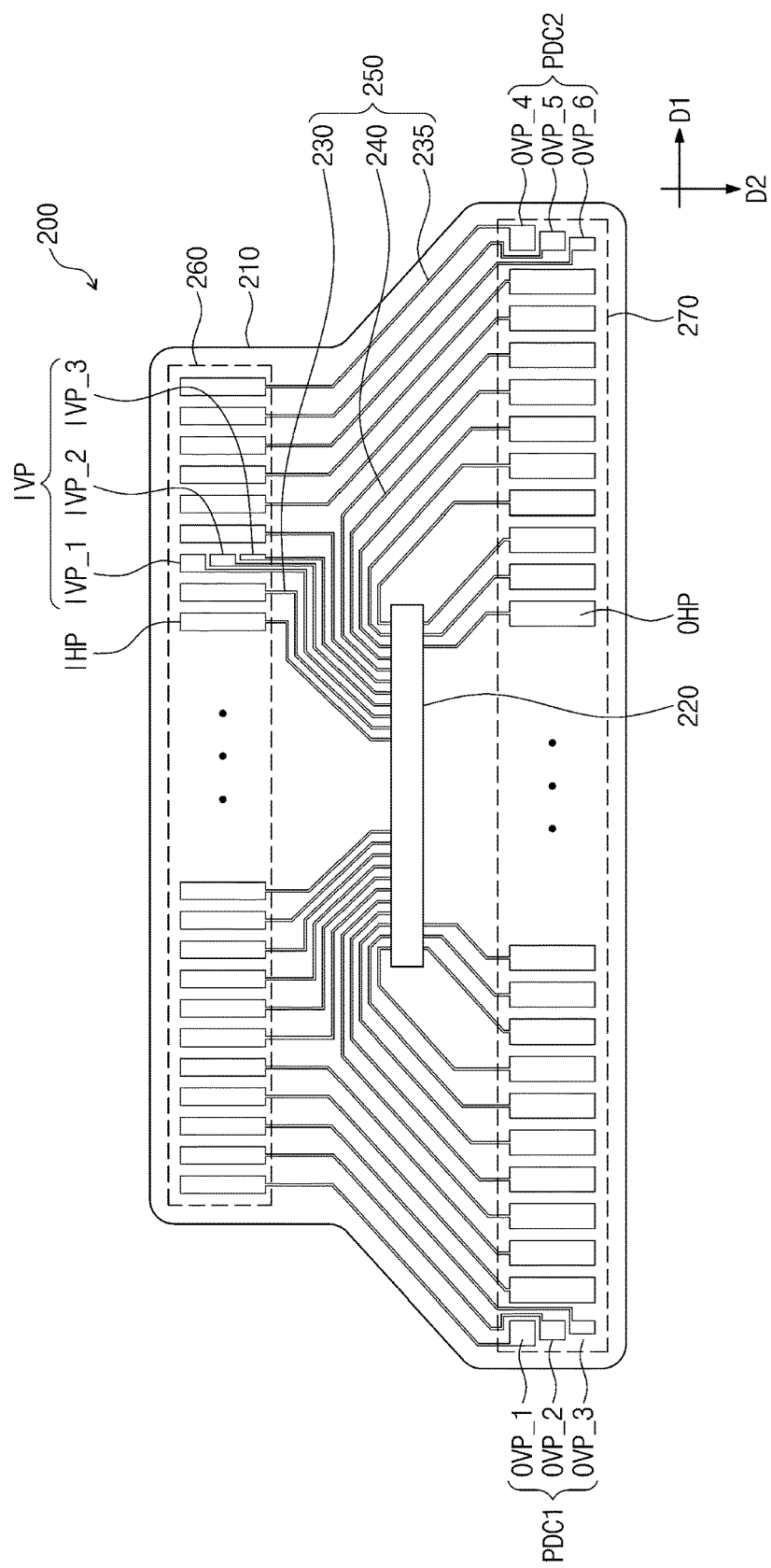
FIG. 11 is a top plan view illustrating an exemplary embodiment of a pad structure of a flexible film employed in the display apparatus of FIG. 10.

FIG. 11 is a top plan view illustrating an exemplary embodiment of a pad structure of a flexible film employed in the display apparatus FIG. 10.

Referring to FIG. 11, the flexible film 200 may further include a plurality of input pads 260 and a plurality of output pads 270. Since the plurality of input pads 260 have the same structure as the structure illustrated in FIG. 5, detailed descriptions thereof will not be provided.

The plurality of output pads 270 are provided at an end portion of the flexible film 200 at the second side of a base film 210 and are connected to ends of a plurality of output wirings 240 and a plurality of input connecting wirings 235.

The plurality of input pads 270 includes a pad OHP provided in plural and arranged in a horizontal direction (referred hereinafter as "a plurality of horizontally arranged pads OHP") and a vertical pad provided in plural each as a collection of a plurality of vertically arranged pads or sub-pads (hereinafter generally referred to as "a plurality of vertically arranged pads").

The horizontally arranged pads OHP are arranged in a first direction D1 to define one pad row. The vertically arranged pads within a single vertical pad are arranged in a second direction D2 in the same pad row.

The vertically arranged pads within a single vertical pad may define a pad column. Referring to FIG. 11, the two vertical pads define a plurality of pad columns PDC1 and PDC2. FIG. 11 illustrates, as an exemplary embodiment of the invention, a structure in which the vertically arranged pads within a single vertical pad respectively define first and second pad columns PDC1 and PDC2 on outermost portions of opposing sides of the flexible film 200.

The first pad column PDC1 includes a first vertically arranged pad (or sub-pad) OVP_1, a second vertically arranged pad (or sub-pad) OVP_2 and a third vertically arranged pad (or sub-pad) OVP_3. The second pad column PDC2 includes a fourth vertically arranged pad (or sub-pad) OVP_4, a fifth vertically arranged pad (or sub-pad) OVP_5 and a sixth vertically arranged pad (or sub-pad) OVP_6.

FIG. 11 illustrates a structure in which the first to sixth vertically arranged pads OVP_1 to OVP_6 are connected to connecting wirings 235, but the invention is not limited thereto. That is, the vertically arranged pads within a vertical pad may be pads connected to the output wirings 240.

Also, the disposition structure of the plurality of output pads 270 is not limited to the structure of FIG. 11. That is, the plurality of output pads 270 may have a disposition structure illustrated in FIGS. 3 and 4 and may be expanded to other disposition structures.

Although not shown, about 20% or more of the plurality of output pads 270 are formed as vertical pads each having the plurality of vertically arranged pads, and thus a pad forming space may be sufficiently secured inside the flexible film 200 of a given size even when the number of the pads is increased.

In particular, in a state in which the width of the flexible film 200 in the first direction D1 is constrained, when the number of the output pads 270 is increased, some of the output pads 270 may be arranged in the second direction D2. As such, usability of a limited space of the flexible film 200 may be improved.

Figure 12:
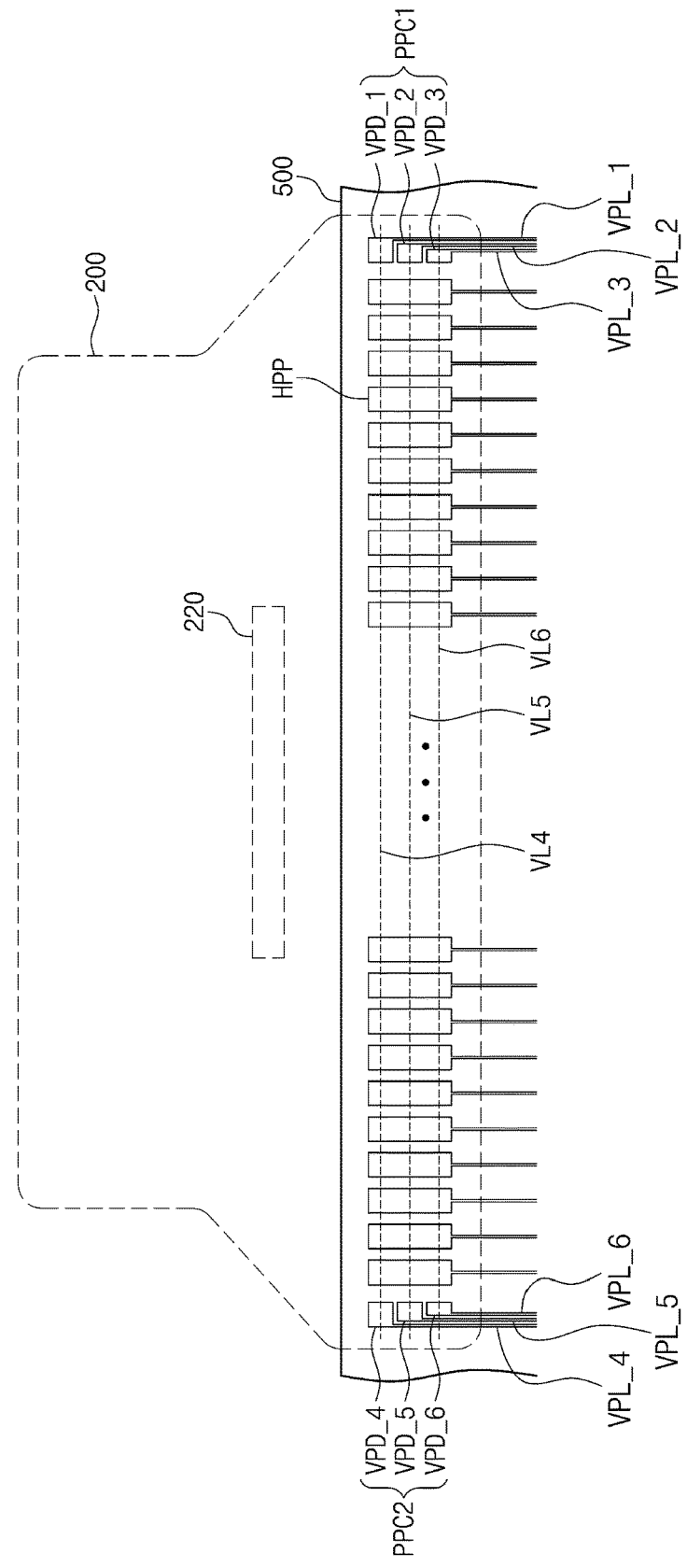
FIG. 12 is a top plan view illustrating an exemplary embodiment of a panel pad structure of the display panel of the display apparatus illustrated in FIG. 10.
Figure 13:
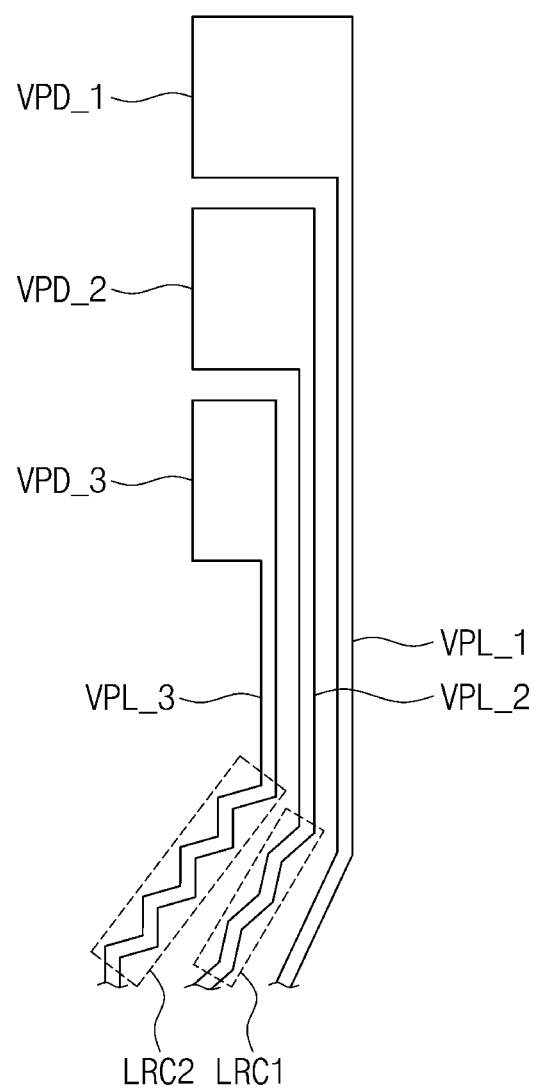
FIG. 13 is a top plan view illustrating an exemplary embodiment of second and third vertical panel wiring of a flexible film, which has a bending pattern, according to the invention.

FIG. 12 is a top plan view illustrating an exemplary embodiment of a pad structure of the display panel of the display apparatus illustrated in FIG. 10, and FIG. 13 is a top plan view illustrating an exemplary embodiment of second and third vertical panel wiring which has a bending pattern according to the invention.

Referring to FIG. 12, a display panel 500 includes a plurality of panel pads connected one to one to a plurality of output pads 270 of a flexible film 200. When the plurality of output pads 270 of the flexible film 200 have the pad structure illustrated in FIG. 11, the panel pads of the display panel 500 have a pad structure corresponding to the output pads 270.

Specifically, the plurality of panel pads includes a horizontal panel pad HPP provided in plural and arranged in a horizontal direction (referred hereinafter as "a plurality of horizontal panel pads HPP") and a vertical panel pad provided in plural each as a collection of a plurality of vertical panel pads or panel sub-pads (hereinafter generally referred to as "a plurality of vertically arranged pads"). The plurality of horizontal panel pads HPP of the display panel 500 are arranged corresponding to a plurality of horizontally arranged pads OHP of the flexible film 200 (shown in FIG. 11) in a first direction D1 to define a panel pad row.

The plurality of vertical panel pads are disposed corresponding to the plurality of vertically arranged pads OVP_1 through OVP_6 of the flexible film 200 and are arranged within a single vertical panel pad in the same panel pad row in a second direction D2.

The vertical panel pads within a single vertical panel pad may define a panel pad column. Referring to FIG. 12, the two vertical panel pads define a plurality of panel pad columns PPC1 and PPC2. In FIG. 12, as an exemplary embodiment of the invention, the plurality of panel pad columns PPC1 and PPC2 of the display panel 500 may include first and second panel pad columns PPC1 and PPC2 respectively corresponding to the first and second pad columns PDC1 and PDC2 of the flexible film 200.

The first panel pad column PPC1 includes a first vertical panel pad (or panel sub-pad) VPD_1, a second vertical panel pad (or panel sub-pad) VPD_2 and a third vertical panel pad (or panel sub-pad) VPD_3. The second panel pad column PPC2 includes a fourth vertical panel pad (or panel sub-pad) VPD_4, a fifth vertical panel pad (or panel sub-pad) VPD_5 and a sixth vertical panel pad (or panel sub-pad) VPD_6.

Within a same panel pad row, the first and fourth vertical panel pads VPD_1 and VPD_4 are disposed on a fourth virtual line VL4 extending in the first direction D1, and the second and fifth vertical panel pads VPD_2 and VPD_5 are disposed on a fifth virtual line VL5 parallel to the fourth virtual line VL4, and third and sixth vertical panel pads VPD_3 and VPD_6 are disposed on a sixth virtual line VL6 parallel to the fourth and fifth virtual lines VL4 and VL5.

With reference to an outer edge of the display panel 500 extending in the first direction D1, the sixth virtual line VL6 is disposed further inside the display panel 500 than the fourth and fifth virtual lines VL4 and VL5, and the fifth virtual line VL5 is disposed further inside the display panel 500 than the fourth virtual line VL4. Here, the term "disposed further inside the display panel 500" may be defined as a meaning of "disposed further adjacent to a display region DA" of the display panel 500.

Here, the horizontal panel pads HPP are respectively disposed to overlap each of the fourth to sixth virtual lines VL4 to VL6. The first and fourth vertical panel pad VPD_1 and VPD_4 are disposed not to overlap the fifth and sixth virtual lines VL5 and VL6, and the second and fifth vertical panel pad VPD_2 and VPD_5 are disposed not to overlap the forth and sixth virtual lines VL4 and VL6.

The third and sixth virtual panel pad VPD_3 and VPD_6 are disposed not to overlap the fourth and fifth virtual lines VL4 and VL5.

The display panel 500 includes a first vertical panel wiring VPL_1 connected to the first vertical panel pad VPD_1, and a second vertical panel wiring VPL_2 connected to the second vertical panel pad VPD_2, and a third vertical panel wiring VPL_3 connected to the third vertical panel pad VPD_3. The display panel 500 further includes a fourth vertical panel wiring VPL_4 connected to the fourth vertical panel pad VPD_4, and a fifth vertical panel wiring VPL_5 connected to the fifth vertical panel pad VPD_5, and a sixth vertical panel wiring VPL_6 connected to the sixth vertical panel pad VPD_6.

As illustrated in FIG. 13, each of the first to third vertical panel wirings VPL_1, VPL_2 and VPL_3 has an overall length different from each other in the second direction D within the same panel pad row. In an exemplary embodiment, for example, the second vertical panel wiring VPL_2 may have an overall length smaller than that of the first vertical panel wiring VPL_1, and the third vertical panel wiring VPL_3 may have an overall length smaller than that of the second vertical panel wiring VPL_2. An actual length of the panel wiring may be defined along an actual profile of the panel wiring, different from an overall length occupied by the panel wiring in the second direction.

In consideration of electrical resistance of the wirings, to compensate such a difference of the overall lengths within a panel pad row and provide substantially equal actual lengths for the first to third vertical panel wirings VPL_1, VPL_2 and VPL_3, the second and third vertical panel wirings VPL_2 and VPL_3 may respectively include first and second bending patterns LRC1 and LRC2 to increase the actual lengths thereof within the panel pad row. The first and second bending patterns LRC1 and LRC2 may be provided between the second and third vertical panel pads VPD_2 and VPD_3 and the display region DA of the display panel 500. Specifically, the first and second bending patterns LRC1 and LRC2 may be arranged or formed by bending each of the second and third vertical panel wirings VPL_2 and VPL_3 several times in a specific region. According to the number of bends within the first and second bending patterns LRC1 and LRC2, the entire wiring electrical resistance of each of the second and third vertical panel wirings VPL_2 and VPL_3 may be adjusted.

The entire length of each of the first to third vertical panel wirings VPL_1, VPL_2 and VPL_3 may be substantially the same as each other due to the first and second bending patterns LRC1 and LRC2 respectively of the second and third vertical panel wirings VPL_2 and VPL_3, and consequently, the difference in wiring electrical resistance of each of the first to third vertical panel wirings VPL_1, VPL_2 and VPL_3 may be reduced.

Similar to that described for the first to third vertical panel wirings VPL_1, VPL_2 and VPL_3, the fourth to sixth vertical panel wirings VPL_4, VPL_5 and VPL_6 may have a length different from each other within the same panel pad row. Although not shown, to compensate such a length difference, the fifth and sixth vertical panel wirings VPL_5 and VPL_6 may respectively include third and fourth bending patterns, similar to the second and third vertical panel wirings VPL_2 and VPL_3 respectively including the first and second bending patterns LRC1 and LRC2 described above.

According to one or more exemplary embodiment of the invention, a space in which pads and leads are disposed or formed may be maximally utilized in a flexible film, a circuit board and a display panel which have limited sizes and are connected to each other. The space is maximized by providing vertically arranged pads and leads of a flexible film, a circuit board and a display panel.

Thus, with an increase in size and resolution of a display apparatus and the display panel thereof, an increased number of pads and leads of a flexible film and a circuit board connected to the display panel may be disposed without undesirably increasing the overall sizes of the films and circuit boards.

While exemplary embodiments are described above, a person skilled in the art may understand that many modifications and variations may be made without departing from the spirit and scope of the present disclosure defined in the following claims.

What is claimed is:

1. A flexible film comprising:
    a base film comprising an edge portion which extends in a first direction;
    a plurality of wirings disposed on the base film; and
    a plurality of pads which is disposed in the edge portion of the base film and connected to the plurality of wirings,
    wherein the plurality of pads disposed in the edge portion comprise:
        a plurality of horizontal pads horizontally arranged in the first direction to define a pad row extended in the first direction; and
        a vertical pad comprising a plurality of vertically arranged pads arranged in a second direction perpendicular to the first direction,
        wherein the plurality of vertically arranged pads are disposed between a h-th horizontal pad and a (h+1)-th horizontal pad among the plurality of horizontal pads, where the h is a natural number.

2. The flexible film of claim 1, wherein
    each of the horizontal pads and each of the vertically arranged pads defines a length thereof larger than a width thereof, the lengths extending in the second direction, and
    the length of each of the vertically arranged pads in the second direction is smaller than the length of each of the horizontal pads in the second direction.

3. The flexible film of claim 2, wherein the length of each of the horizontal pads in the second direction is at least two times greater than the length of each of the vertically arranged pads in the second direction.

4. The flexible film of claim 1, wherein
    the vertically arranged pads within the vertical pad define a pad column of the flexible film, and
    at least two vertically arranged pads are disposed in the pad column of the flexible film.

5. The flexible film of claim 1, wherein
    the base film comprises a mounting region thereof at which a chip through which a signal from outside the flexible film passes is mounted, and
    the plurality of wirings of the flexible film comprise:
        a plurality of input wirings disposed on a first side of the mounting region and through which the signal is input to the chip; and
        a plurality of output wirings disposed on a second side of the mounting region opposite to the first side thereof and through which the signal is output from the chip.

6. The flexible film of claim 5, wherein
    the plurality of pads of the flexible film further comprise:
        a plurality of input side pads connected to the plurality of input wirings; and
        a plurality of output side pads connected to the plurality of output wirings,
        wherein at least one of the output side pads and the input side pads includes the plurality of horizontal pads horizontally arranged and the vertical pad comprising the plurality of vertically arranged pads.

7. The flexible film of claim 1, wherein within a same pad row extended in the first direction,
    the plurality of pads of the flexible film are disposed in a plurality of pad sub-rows each extended in the first direction, and
    the plurality of vertically arranged pads are respectively provided in the pad sub-rows.

8. The flexible film of claim 1, wherein
    the edge portion of the base film extends from an outer edge of the base film,
    within a same pad row extended in the first direction,
        a first virtual line extends in the first direction,
        a second virtual line extends parallel to the first virtual line and is spaced further from the outer edge in the second direction than the first virtual line,
    the plurality of vertically arranged pads within the vertical pad comprise:
        a first vertically arranged pad disposed on the first virtual line extending in the first direction and non-overlapping with the second virtual line; and
        a second vertically arranged pad disposed on the second virtual line and non-overlapping with the first vertical lines, and
    each of the horizontal pads horizontally arranged is disposed to overlap both of the first and second virtual lines.

9. The flexible film of claim 8, wherein
    each of the vertically arranged pads defines a length thereof larger than a width thereof, the widths extending in the first direction, and
    the width of the first vertically arranged pad in the first direction is greater than the width of the second vertically arranged pad in the first direction.

10. The flexible film of claim 8, wherein the plurality of wirings of the flexible film comprise:
    a first vertically arranged wiring extended from and connected to the first vertically arranged pad; and a second vertically arranged wiring extended from and connected to the second vertically arranged pad, wherein the first vertically arranged wiring is disposed to be spaced apart a predetermined distance in the first direction from the second vertically arranged pad.

11. A circuit board assembly comprising:

a circuit board which provides a signal; and a flexible film which is attached to and receives the signal from the circuit board, wherein the flexible film comprises:

a base film comprising an edge portion which extends in a first direction;

a plurality of wirings disposed on the base film; and a plurality of pads which is disposed in the edge portion of the base film and connected to the plurality of wirings, wherein the plurality of pads disposed in the edge portion comprise:

a plurality of horizontal pads horizontally arranged in the first direction to define a pad row extended in the first direction; and a vertical pad comprising a plurality of vertically arranged pads arranged in a second direction perpendicular to the first direction, wherein the plurality of vertically arranged pads are disposed between a h-th horizontal pad and a (h+1)-th horizontal pad among the plurality of horizontal pads, where the h is a natural number.

12. The circuit board assembly of claim 11, wherein the circuit board comprises:

an edge portion which extends in the first direction, and a plurality of leads which is disposed in the edge portion of the circuit board and connected to the plurality of pads of the flexible film, and the plurality of leads in the edge portion of the circuit board comprises:

a plurality of horizontal leads horizontally arranged in the first direction and respectively corresponding to the plurality of horizontal pads horizontally arranged of the flexible film, to define a lead row extended in the first direction; and a vertical lead comprising a plurality of vertically arranged leads arranged in the second direction and respectively corresponding to the plurality of vertically arranged pads of the flexible film, within a same lead row in which the plurality of horizontal leads are horizontally arranged.

13. The circuit board assembly of claim 12, wherein the circuit board further comprises:

a plurality of horizontally arranged wirings respectively extended from and connected to the plurality of horizontal leads horizontally arranged; and a plurality of vertically arranged wirings respectively extended from and connected to the plurality of vertically arranged leads.

14. The circuit board assembly of claim 13, wherein the edge portion of the circuit board extends from an outer edge of the circuit board, within the same lead row extended in the first direction, a first virtual line extends in the first direction, and a second virtual line extends parallel to the first virtual line and is spaced further from the outer edge of the circuit board in the second direction than the first virtual line, the plurality of vertically arranged leads within the vertical lead of the circuit board comprise:

a first vertically arranged lead disposed on the first virtual line extending in the first direction and non-overlapping with the second virtual line; and a second vertically arranged lead disposed on the second virtual line and non-overlapping with the first virtual line, and each of the plurality of horizontal leads horizontally arranged is disposed to overlap both the first and second virtual lines.

15. The circuit board assembly of claim 14, wherein the plurality of vertically arranged wirings of the circuit board comprise:

a first vertically arranged wiring extended from and connected to the first vertically arranged lead, and a second vertically arranged wiring extended from and connected to the second vertically arranged lead.

16. The circuit board assembly of claim 15, wherein the circuit board further comprises a plurality of sub circuit boards laminated in a thickness direction of the circuit board, and among the plurality of sub circuit boards of the circuit board, the first and second vertically arranged wirings are disposed on sub circuit boards different from each other.

17. The circuit board assembly of claim 16, wherein each of the vertically arranged leads defines a length thereof larger than a width thereof, the widths extending in the first direction, and the width of the first vertically arranged lead in the first direction is the same as the width of the second vertically arranged lead in the first direction.

18. A display apparatus comprising:

a display panel which generates and displays an image with a signal provided thereto;

a circuit board which provides the signal; and a flexible film which is attached to the display panel and the circuit board and through which the signal passes from the circuit board to the display panel, wherein the flexible film comprises:

a base film comprising an edge portion which extends in a first direction;

a plurality of wirings disposed on the base film; and a plurality of pads which is disposed in the edge portion of the base film and connected to the plurality of wirings, wherein the plurality of pads disposed in the edge portion comprise:

a plurality of horizontal pads horizontally arranged in the first direction to define a pad row extended in the first direction; and a vertical pad comprising a plurality of vertically arranged pads arranged in a second direction perpendicular to the first direction, wherein the plurality of vertically arranged pads are disposed between a h-th horizontal pad and a (h+1)-th horizontal pad among the plurality of horizontal pads, where the h is a natural number.

19. The display apparatus of claim 18, wherein the display panel comprises:

an edge portion which extends in the first direction, and a plurality of panel pads which is disposed in the edge portion of the display panel and connected to the plurality of pads of the flexible film, and the plurality of panel pads disposed in the edge portion of the display panel includes:

a plurality of horizontal panel pads horizontally arranged in the first direction and respectively corresponding to the plurality of horizontal pads horizontally arranged of the flexible film, to define a panel pad row extended in the first direction; and a vertical panel pad comprising a plurality of vertically arranged panel pads arranged in the second direction and respectively corresponding to the plurality of vertically arranged pads of the flexible film, within a same panel pad row in which the plurality of horizontal panel pads horizontally arranged.

20. The display apparatus of claim 19, wherein the display panel further comprises:

a plurality of horizontal panel wirings respectively extended from and connected to the plurality of horizontal panel pads horizontally arranged; and a plurality of vertical panel wirings respectively extended from and connected to the plurality of vertically arranged panel pads.

21. The display apparatus of claim 20, wherein the edge portion of the display panel extends from an outer edge of the display panel, within the same panel pad row extended in the first direction, a first virtual line extends in the first direction, and a second virtual line extends parallel to the first virtual line and is spaced further from the outer edge of the display panel in the second direction than the first virtual line, and the plurality of vertically arranged panel pads within the vertical panel pad comprise:

a first vertically arranged panel pad disposed on the first virtual line extending in the first direction and non-overlapping the second virtual line; and a second vertically arranged panel pad disposed on the second virtual line and non-overlapping with the first virtual line, and each of the horizontal panel pads horizontally arranged is disposed to overlap both the first and second virtual lines.

22. The display apparatus of claim 21, wherein the plurality of vertical panel wirings of the display panel comprise:

a first vertical panel wiring extended from and connected to the first vertically arranged panel pad; and a second vertical panel wiring extended from and connected to the second vertically arranged panel pad, and within the same panel pad row extended in the first direction, the first and second vertical panel wirings have overall lengths in the second direction different from each other.

23. The display apparatus of claim 22, wherein within the same panel pad row extended in the first direction, an overall length of the second vertical panel wiring in the second direction is smaller than an overall length of the first vertical panel wiring in the second direction, and the second vertical panel wiring comprises a bending pattern.

24. A flexible film comprising:

a base film defining an edge of the flexible film which extends in a first direction, in a top plan view; and a plurality of pads disposed on the base film, through which an electrical signal is input to the flexible film or output from the flexible film, and which are arranged along a single line in the first direction within a single pad row along the edge of the flexible film, wherein for the plurality of pads arranged in the single pad row, the base film comprises a plurality of individual pad areas in which a pad is disposed on the base film, the individual pad areas arranged spaced apart from each other in the first direction within the single pad row, and a total number of the pads arranged in the single line is smaller than a number of the plurality of individual pad areas in the single pad row, wherein the plurality of pads comprise:

a plurality of horizontal pads horizontally arranged in the first direction to define a pad row extended in the first direction; and a vertical pad comprising a plurality of vertically arranged pads arranged in a second direction perpendicular to the first direction, wherein the plurality of vertically arranged pads are disposed between a h-th horizontal pad and a (h+1)-th horizontal pad among the plurality of horizontal pads, the h is a natural number.

25. A flexible film comprising:

a base film defining an edge of the flexible film which extends in a first direction;

a plurality of wirings disposed on the base film, and a plurality of pads arranged in the first direction within a pad row at the edge of the flexible film and connected to the plurality of wirings, wherein for a same pad row, a maximum pad length extending in a second direction perpendicular to the first direction, among the plurality of pads in the same pad row, defines a boundary of the same pad row in the second direction, and within the boundary in the second direction of the same pad row, the plurality of pads comprise:

a plurality of horizontal pads horizontally arranged in the first direction; and a vertical pad comprising a plurality of vertically arranged pads arranged in the second direction, wherein the plurality of vertically arranged pads are disposed between a h-th horizontal pad and a (h+1)-th horizontal pad among the plurality of horizontal pads, where the h is a natural number.

* * * * *